United States Patent [19]

Aoki et al.

[11] Patent Number: 5,219,608
[45] Date of Patent: Jun. 15, 1993

[54] METHOD OF SPRAYING RELEASE AGENT

[75] Inventors: Kazumasa Aoki, Tenri; Kazuya Fujita, Nabari; Hirofumi Uchida, Yamato-Koriyama; Takaaki Tsuda, Tenri; Takamichi Maeda, Yamato-Koriyama, all of Japan

[73] Assignee: Sharp Kabushiki Kaishi, Osaka, Japan

[21] Appl. No.: 745,074

[22] Filed: Aug. 15, 1991

[30] Foreign Application Priority Data

Sep. 27, 1990 [JP] Japan .................................. 2-257945

[51] Int. Cl.5 ............................................. B05D 1/02
[52] U.S. Cl. .................................... 427/133; 427/135; 427/256; 427/287; 427/421; 264/272.17; 264/338
[58] Field of Search ............... 427/133, 135, 421, 287, 427/256; 264/272.17, 338

[56] References Cited

U.S. PATENT DOCUMENTS

| 4,442,056 | 4/1984 | Slepcevic ......................... 264/272.17 |
| 4,470,940 | 9/1984 | Whitehurst ............................ 264/338 |
| 4,741,507 | 5/1988 | Baird ............................... 264/272.17 |
| 5,064,583 | 11/1991 | Dagostino et al. ................. 427/133 |

Primary Examiner—Janyce Bell
Attorney, Agent, or Firm—Nixon & Vanderhye

[57] ABSTRACT

A method of spraying release agent on a semiconductor chip molding die. The die has a pot for supplying resin to be molded, cavities in which semiconductor chips to be packaged are disposed, respectively, and a runner disposed between the pot and the cavities, for conducting the resin from the pot to the cavities. This method includes the steps of spraying at least the pot and the runner mentioned above with non-silicone release agent and selectively spraying only the cavities with silicone-based release agent.

7 Claims, 4 Drawing Sheets

METHOD OF SPRAYING RELEASE AGENT

BACKGROUND OF THE INVENTION

1. Field of the Invention

The present invention relates to a method of spraying a molding die with release agent before molding a package of at least one semiconductor chip.

2. Description of the Related Art

It is possible to facilitate the ejection of molded parts from a molding die by adding sufficient amount of release agent to black resin to be molded for packaging ordinary IC (Integrated Circuit) chips, or LSI (Large Scale Integrated circuit) chips such as memory chips, for example. However, when packaging semiconductor chips for optical applications, such as CCD (Charge Coupled Device) shift registers with transparent resin, if release agent is mixed in this transparent resin, there is a possibility that the transmittance decreases or a faulty image pickup occurs, so that the release agent cannot be contained sufficiently in the resin.

When there is a trace amount of release agent contained in the transparent resin, if packaging is performed by molding this resin, the release characteristics of the release agent are notably poor, resulting in the occurrence of exterior defects such as cracking or delamination in the molded transparent resin. For this reason, it has been a conventional practice to form a release agent layer between the die and the resin by spraying a silicone-containing release agent on the whole surface of the die.

When resin moldings are executed by spraying a silicone-based release agent on the whole surface of the die, the silicone components in the release agent remain in large amounts as foreign substances in the molded resin. More specifically, the resin from the pot flows, while entrapping some of the release agent adhering to the surfaces of the pot, the runner and the gates, and is poured into the cavities. The silicone components of the release agent entrapped in the resin remain as foreign substances in the resin, and those foreign substances act as optical defects when the molded packages are used in an optical system. If resin moldings are made by spraying the whole surfaces of the die with fluorine-based release agent not containing silicone components, the components of the release agent do not remain as foreign substances in the resin. However, fluorine-based release agents of this kind are extremely inferior in release characteristics to silicone-based release agents. Therefore, when a molded part is removed from the die, it is subjected to a tensile stress, and exterior imperfections such as cracking and delamination occur.

SUMMARY OF THE INVENTION

It is therefore an object of the present invention to provide a method of spraying release agent, which makes it possible to produce molded resin superior with optical characteristics while maintaining the good release characteristics of the release agent.

SUMMARY

The above-mentioned object can be achieved, according to the present invention, by a method of spraying release agent on a semiconductor chip molding die provided with a pot for supplying resin to be molded, cavities in which semiconductor chips to be packaged are disposed, and a runner disposed between the pot and the cavities, for conducting the resin from the pot to the cavities. The method includes the steps of spraying the pot and the runner with non-silicone release agent, and selectively spraying only the cavities with silicone-based release agent.

The silicone-based release agent is sprayed only on the cavities, and the non-silicone release agent is sprayed on the pot and the runner, and also on the cavities when necessary. Because the non-silicone release agent is sprayed on the pot and the runner other than the cavities, even if the resin entraps some of the release agent, foreign substances do not remain in the resin. Moreover, the silicone-based release agent is sprayed on the cavities, which contributes to a significant improvement in the release characteristics. It ought to be noted that even if the silicone-based release agent is applied to the cavities, the foreign substances in the release agent hardly enter molded parts. Even when they enter, they are located only near the surfaces of molded packages, and do not go into the interior of the packages. Therefore, by grinding off the surfaces of the molded packages, the optical defects can be eliminated.

It is preferred that the non-silicone release agent may be sprayed to the entire of the molding die.

The non-silicone release agent may be sprayed to the pot and the runner only.

The spraying of the non-silicone release agent may be executed before the spraying of the silicone-based release agent.

Conversely, the spraying of the silicone-based release agent may be executed before the spraying of the non-silicone release agent.

The non-silicone release agent is preferably a fluorine-based release agent.

Further objects and advantages of the present invention will be apparent from the following description of the preferred embodiments of the invention as illustrated in the accompanying drawings.

DESCRIPTION OF THE PREFERRED EMBODIMENTS

Figure 1:
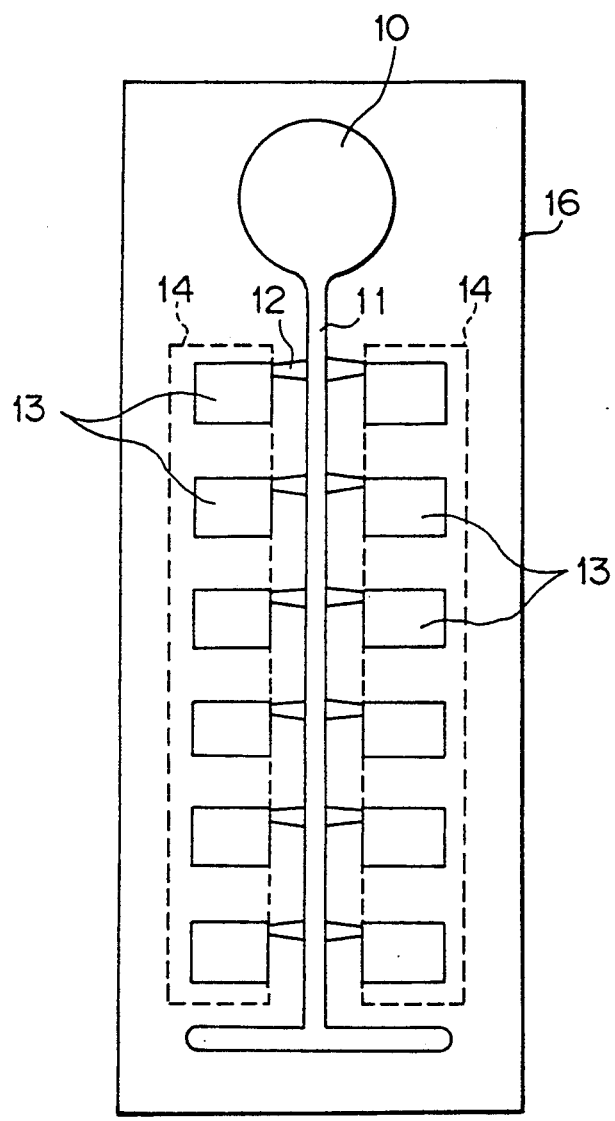
FIG. 1 schematically shows a bottom face of a semiconductor package molding die where a release agent is sprayed in a preferred embodiment of the present invention.

FIG. 1 is a plan view showing a bottom face of the semiconductor chip molding die in which release agent is sprayed in a preferred embodiment according to the present invention.

In FIG. 1, reference numeral 10 indicates a pot for supplying resin to be molded. The pot 10 communicates with a runner 11. This runner 11 communicates through gates 12 with a plurality of cavities 13 where semiconductor chips for optical applications, such as CCDs, are disposed, respectively. In practice, the semiconductor chip molding die is constituted by a top face 15 shown in FIG. 3 and a bottom force 16 shown in FIG. 1.

Figure 2:
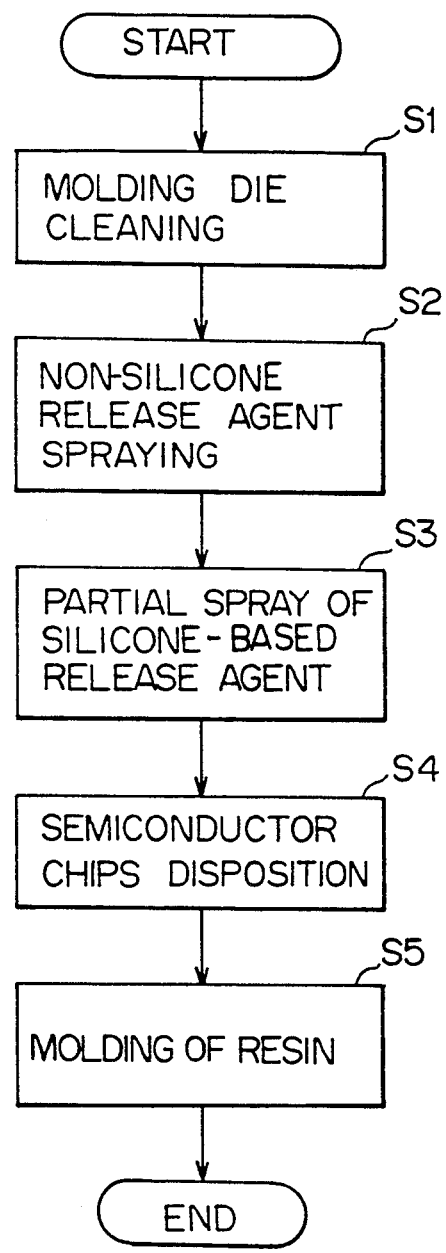
FIG. 2 shows an example of the process of molding resin for packaging semiconductor chips.

FIG. 2 is a flowchart showing an example of the molding process for packaging semiconductor chips for optical applications. Referring to FIG. 2, the molding process and the release agent spraying procedure will be described.

First, at step S1, the mold-side surfaces of the top face 15 and the bottom face 16 of the die are cleaned. Then, at step S2, the whole surfaces of the die are sprayed with non-silicone release agent not containing silicone components, a fluorine-based release agent, for example. At next step S3, only the inner surfaces of the cavities 13 are sprayed with silicone-based release agent. To be more specific, by the steps S2 and S3, the cavity regions 14 indicated by the broken lines are selectively sprayed in partial spray with a silicone-based release agent. This partial spray is carried out, for instance, by using a mask covering the irrelevant area or by putting up a screen to prevent the spray from extending to the irrelevant area. Next, at step S4, semiconductor chips for optical applications, which have already been mounted on respective lead frames, are disposed in the cavities 13, respectively. Then, at step S5, the bottom face 16 is closed with the top face 15 and transparent resin is poured into the cavities 13 so as to be molded.

Figure 3:
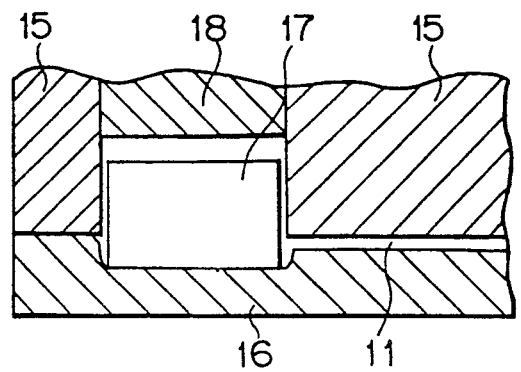
FIG. 3 shows the pot and a part of the runner of the semiconductor chip molding die of FIG. 1.

FIG. 3 is a sectional view showing the pot 10 and a part of the runner 11 of a semiconductor molding die of FIG. 1. As is evident from FIG. 3, a resin tablet 17 charged into the pot 10 is compressed by a plunger 18, heated, and fluidized. The transparent resin that has fluidized in the pot 10 is conducted through the runner 11, and pours through the gates 12 into the cavities 13. The resin that has flowed into the cavity cures, thus sealing the semiconductor chips 19 for optical applications.

Figure 4:
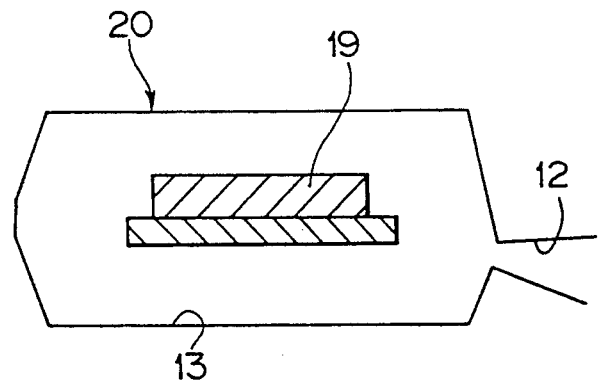
FIG. 4 shows a cavity of the semiconductor chip molding die of FIG. 1.

The optical semiconductor packages thus molded are, after removal from the cavities, ground so as to make their optical surfaces (in the case of CCDs, which are image pickup surfaces of the molded packages, namely as a surface indicated by numeral 20 in FIG. 4) like a mirror surface.

As has been described, according to the present invention, the cavity regions 14 have been sprayed with silicone-based release agent, and the areas other than the cavity regions 14 have been sprayed with non-silicone release agent. Out of all the resin poured into the cavities, that part of the resin located near the inner surfaces of the cavities hardly flows and cures where it is, and therefore, hardly any of the silicone-based release agent adhering to the inner surfaces of the cavities is entrapped into the inside of the resin. Even if a small amount of the release agent is entrapped in the region close to the inner surfaces of the cavities, that peripheral region is removed by a subsequent step of grinding the surfaces of the molded packages. So, there is no possibility that optical defects occur. The release agent adhering to the area other than the cavity regions 14, that is, to the surfaces of the pot 10 and the runner 11, for example, is entrapped into the inside of the resin, and the resin flows into the cavities 13. However, since the pot 10 and the runner 11 are coated only with non-silicone release agent not containing foreign substances, there are no chances of optical defects occurring. Furthermore, since the cavities 13 are sprayed with silicone-based release agent having excellent release characteristics, there is no problem with the release characteristics of the molded resin with optical semiconductor chips. Nor do the exterior imperfections such as cracking and delamination occur when the molded packages are removed from the cavities.

In the above-mentioned embodiment, non-silicone release agent not containing silicone components, fluorine-based release agent, for example, is sprayed on the whole area of the molding die. However, non-silicone release agent may be sprayed only on the area other than the cavity regions 14, that is, only on the pot 10 and the runner 11, for example.

Figure 5:
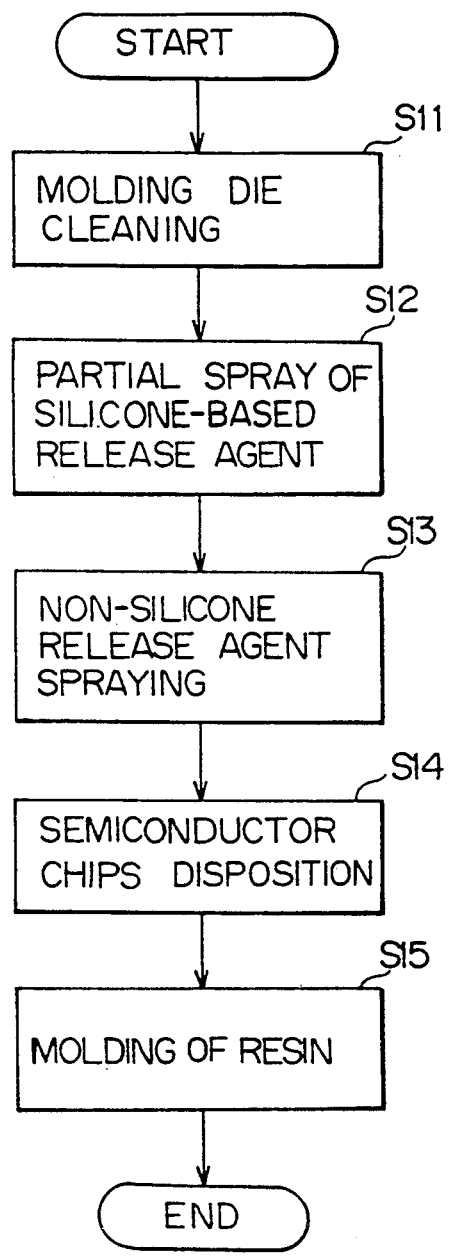
FIG. 5 shows another example of the process of molding resin for packaging semiconductor chips.

The spray sequence of non-silicone release agent and silicone-based release agent may be the opposite of the example of FIG. 2, as shown in FIG. 5.

More specifically, in the example of FIG. 5, steps S12 and S13 are provided which have reversed the sequence of the steps S2 and S3 in FIG. 2.

The processes in the remaining steps S11, S14 and S15 are the same processes as at the steps S1, S4 and S5 of FIG. 2.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of spraying release agent on a semiconductor chip molding die provided with a pot for supplying resin to be molded, cavities in which semiconductor chips to be packaged are disposed, and a runner disposed between said pot and said cavities for conducting the resin from said pot to said cavities, said method comprising the steps of:

spraying said pot and said runner with fluorine-based release agent; and selectively spraying only said cavities with silicone-based release agent.

2. A method as claimed as claim 1, wherein said step of spraying said fluorine-based release agent is a step of spraying the whole of said die with said fluorine-based release agent.

3. A method as claimed as claim 1, wherein said step of spraying said fluorine-based release agent is a step of spraying only said pot and a part of said runner with said fluorine-based release agent.

4. A method as claimed as claim 1, wherein said step of spraying said fluorine-based release agent is executed before said step of spraying silicone-based release agent.

5. A method as claimed as claim 1, wherein said step of spraying silicone-based release agent is executed before said step of spraying said fluorine-based release agent release agent.

6. A method as claimed in claim 1, wherein said non-silicone release agent is fluorine-based release agent.

7. A method of spraying release agent on a semiconductor chip molding die provided with a pot for supplying resin to be molded, cavities in which semiconductor chips to be packaged are disposed, and a runner disposed between said pot and said cavities for conducting the resin from said pot to said cavities, said method comprising the steps of:

spraying said pot and said runner with specific release agent having lower releasability than that of silicone-based release agent; and selectively spraying only said cavities with silicone-based release agent.

* * * * *